United States Patent
Nishimura et al.

(10) Patent No.: US 11,698,273 B2
(45) Date of Patent: Jul. 11, 2023

(54) MAGNETIC DETECTION SYSTEM

(71) Applicant: Shimadzu Corporation, Kyoto (JP)

(72) Inventors: Naoki Nishimura, Kyoto (JP); Kenta Chinomi, Kyoto (JP)

(73) Assignee: Shimadzu Corporation, Kyoto (JP)

( * ) Notice: Subject to any disclaimer, the term of this patent is extended or adjusted under 35 U.S.C. 154(b) by 0 days.

(21) Appl. No.: 17/170,106

(22) Filed: Feb. 8, 2021

(65) Prior Publication Data

US 2021/0278244 A1    Sep. 9, 2021

(30) Foreign Application Priority Data

Mar. 3, 2020   (JP) .................................. 2020-036104

(51) Int. Cl.
*G01D 5/14*    (2006.01)

(52) U.S. Cl.
CPC ...................................... *G01D 5/14* (2013.01)

(58) Field of Classification Search
CPC ....................................................... G01D 5/14
See application file for complete search history.

(56) References Cited

U.S. PATENT DOCUMENTS

| 6,853,194 B2 * | 2/2005 | Nelson | ................... | G01V 3/104 |
| | | | | 324/329 |
| 2018/0348393 A1 | 12/2018 | Hansen et al. | | |

FOREIGN PATENT DOCUMENTS

| JP | S56-137266 A | 10/1981 |
| JP | H03-61890 A | 3/1991 |
| JP | H11-183109 A | 7/1999 |
| JP | 2005195479 A | 7/2005 |
| JP | 2013156225 A | 8/2013 |
| NO | 2005/096790 A2 | 10/2005 |

OTHER PUBLICATIONS

Extended European Search Report (EESR) dated Jul. 23, 2021 for the corresponding European patent application No. 21158729.0.
Notice of Reasons for Refusal dated Apr. 4, 2023 for corresponding Japanese Patent Application No. 2020-036104.

\* cited by examiner

*Primary Examiner* — Walter L Lindsay, Jr.
*Assistant Examiner* — Milton Gonzalez
(74) *Attorney, Agent, or Firm* — Muir Patent Law, PLLC

(57) ABSTRACT

The magnetic detection system 100 is provided with a magnetic sensor 1, a storage unit 5, a first determination unit 42 for outputting whether or not the magnetic body 90 has passed as a first determination result 20, a second determination unit 43 for outputting whether or not the magnetic body has passed as a second determination result 21, a display unit 6 for displaying (notifying) the first determination result and the second determination result. The second determination unit is configured to have higher determination accuracy than the first determination unit.

8 Claims, 12 Drawing Sheets

MAGNETIC DETECTION SYSTEM

CROSS-REFERENCE TO RELATED APPLICATIONS

The priority application number JP2020-036104, entitled "Magnetic Detection System", filed on Mar. 3, 2020, and invented by Nishimura Naoki and Chinomi Kenta, upon which this patent application is based is hereby incorporated by reference in its entirety.

BACKGROUND OF THE INVENTION

Field of the Invention

The present invention relates to a magnetic detection system, and more specifically to a magnetic body detection system equipped with a magnetic sensor for detecting a magnetic body.

Description of the Background Art

Conventionally, a magnetic detection system is known in which a magnetic sensor is equipped to detect a magnetic body. Such a magnetic detection system is disclosed, for example, in Japanese Unexamined Patent Application Publication No. 2013-156225.

Japanese Unexamined Patent Application Publication No. 2013-156225 discloses a magnetic detection system including a magnetic sensor, a calculation unit, and a determination unit. The magnetic detection system disclosed in Japanese Unexamined Patent Application Publication No. 2013-156225 is configured to detect a magnetic body (detection target) passing through the vicinity of the magnetic sensor.

The magnetic sensor is installed underwater. The calculation unit is configured to perform an operation on the approximation degree of the magnetic waveform measured by the magnetic sensor and the predictable noise fluctuation. Further, the calculation unit is configured to perform an operation on the approximation degree of the magnetic waveform measured by the magnetic sensor and the theoretical standard waveform caused by the magnetic body. The determination unit is configured to perform a determination relating to the detection of the magnetic signal, based on the calculation result of the arithmetic unit.

Here, in the magnetic detection system as disclosed in Japanese Unexamined Patent Application Publication No. 2013-156225, it is generally used for detecting a magnetic body approaching a port or the like. The detection of the approach of the magnetic body requires both the determination accuracy and the immediacy from the security-related standpoint. To ensure the immediacy, it is conceivable to determine using a part of the magnetic waveform caused by the magnetic body. However, in a case where a part of the magnetic waveform is used to make the determination, the determination accuracy is lowered. Therefore, in order to compensate for the lowered determination accuracy, it is conceivable to determine by a monitoring person whether or not the magnetic waveform is caused by the magnetic body by directly confirming the magnetic waveform. In this case, the burden on the monitoring person increases. Under the circumstance, a magnetic detection system capable of reducing the burden on the monitoring person while ensuring the immediacy and the determination accuracy is desired.

The present invention has been made to solve the above-described problems, and an object of the present invention is to provide a magnetic detection system capable of reducing a burden on a monitoring person while ensuring immediacy and determination accuracy.

SUMMARY OF THE INVENTION

In order to achieve the above-described object, a magnetic detection system according to one aspect of the present invention includes:

a magnetic sensor configured to be installed underwater to acquire a magnetic signal;

a storage unit configured to store the magnetic signal acquired by the magnetic sensor;

a first determination unit configured to output whether or not a magnetic body has passed as a first determination result based on the magnetic signal of the magnetic sensor;

a second determination unit configured to output whether or not the magnetic body has passed as a second determination result based on the magnetic signal of the magnetic sensor after an output of the first determination result by the first determination unit; and a notification unit configured to output the first determination result and the second determination result, wherein the second determination unit is configured to have higher determination accuracy than the first determination unit.

In the magnetic detection system according to the first aspect of the present invention, by configuring as described above, the first determination result and the second determination result that differ from each other in the output timing and the determination accuracy are notified. Therefore, the monitoring person can determine whether or not a magnetic body has passed, based on the first determination result earlier in the output timing and the second determination result higher in the determination accuracy than the first determination result. Further, the first determination result and the second determination result, which indicate whether or not the magnetic body has passed, are outputted. Therefore, the burden on the monitoring person can be reduced, as compared with the configuration in which the monitoring person determines whether or not it is a magnetic signal caused by a magnetic body by directly confirming the magnetic signal. Consequently, it is possible to provide a magnetic detection system capable of reducing the burden on the monitoring person while ensuring immediacy and determination accuracy.

DESCRIPTION OF PREFERRED EMBODIMENTS

Hereinafter, some embodiments in which the present invention is embodied will be described with reference to the attached drawings.

Referring to FIG. 1 to FIG. 7, a configuration of a magnetic detection system 100 according to an embodiment will be described.

Figure 1:
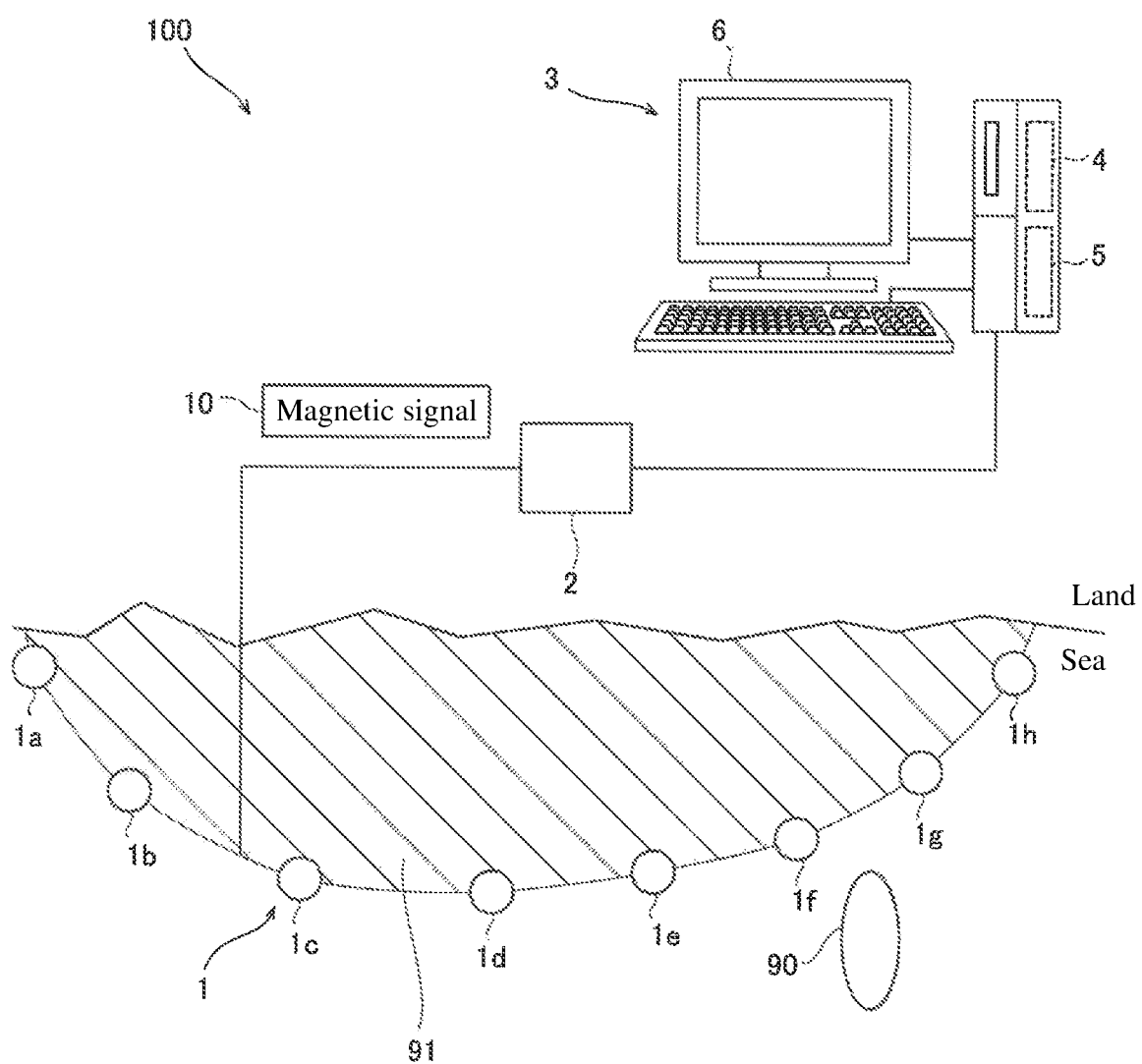
FIG. 1 is a schematic diagram showing an entire configuration of a magnetic detection system according to one embodiment.

The magnetic detection system 100 according to this embodiment is provided with, as shown in FIG. 1, a magnetic sensor 1, a receiving unit 2, and a computer 3. The magnetic detection system 100 of this embodiment detects whether or not the magnetic body 90 has passed by detecting a magnetic signal 10 emitted from the magnetic body 90. Based on the detection result output by the magnetic detection system 100, the monitoring person can recognize whether or not the magnetic body 90 has passed and can consider the countermeasures in accordance with whether or not the magnetic body 90 has passed. The magnetic sensor 1 is installed, for example, in ports and harbors. The magnetic body 90 sensed by the magnetic detection system 100 includes, for example, a vessel or the like.

The magnetic sensor 1 is installed underwater. In this embodiment, a plurality of the magnetic sensors 1 for detecting the passage of the magnetic body 90 is installed in the region 91. The magnetic sensor 1 includes, for example, a first magnetic sensor 1a, a second magnetic sensor 1b, a third magnetic sensor 1c, a fourth magnetic sensor 1d, a fifth magnetic sensor 1e, a sixth magnetic sensor 1f, a seventh magnetic sensor 1g, and an eighth magnetic sensor 1h. The plurality of magnetic sensors 1 is spaced apart from each other in the region 91. The magnetic sensors 1 are connected to the receiving unit 2 with a wire. The magnetic sensor 1 is configured to acquire a magnetic signal 10 caused by the passage of the magnetic body 90. Each magnetic sensor 1 is configured to output, for example, the acquired magnetic signal 10 to the receiving unit 2 installed on land as an optical signal. The magnetic sensor 1 includes, for example, a flux gate type sensor.

The receiving unit 2 is wired to the magnetic sensor 1. The receiving unit 2 is wired to the computer 3. The receiving unit 2 is configured to output the magnetic signal 10 acquired by the magnetic sensor 1 to the computer 3. The receiving unit 2 includes, for example, a transducer that converts the magnetic signal 10 input as an optical signal into an electric signal.

The computer 3 includes a control unit 4, a storage unit 5, and a display unit 6. The display unit 6 is an example of the "notification unit" recited in claims.

Figure 2:
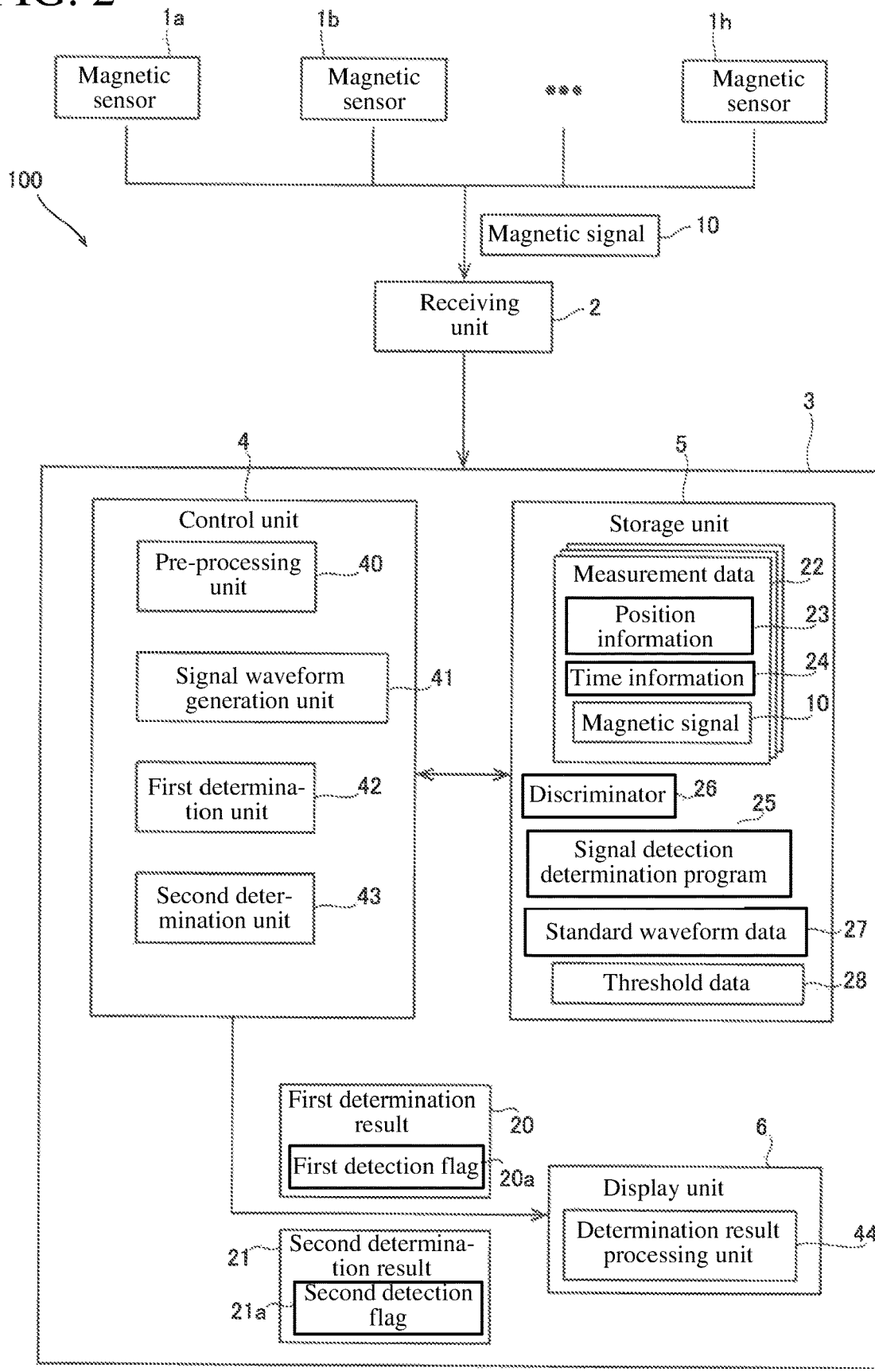
FIG. 2 is a block diagram illustrating a configuration of a magnetic detection system according to one embodiment.

As shown in FIG. 2, the control unit 4 includes a pre-processing unit 40, a signal waveform generation unit 41, a first determination unit 42, and a second determination unit 43. The control unit 4 is configured to function as the pre-processing unit 40, the signal waveform generation unit 41, the first determination unit 42, and the second determination unit 43 by executing various programs stored in the storage unit 5. The control unit 4 includes, for example, a CPU (Central Processing Unit). The pre-processing unit 40 is configured to perform pre-processing of the magnetic signal 10. In this embodiment, the pre-processing unit 40 is configured to remove the high-frequency noise components of the magnetic signal 10. The pre-processing unit 40 includes, for example, a low-pass filter.

The signal waveform generation unit 41 is configured to generate a signal waveform 11 (see FIG. 4) based on the magnetic signal 10 after the pre-processing. For more detailed information on the configuration in which the signal waveform generation unit 41 generates the signal waveform 11 will be described later.

The first determination unit 42 is configured to output whether or not the magnetic body 90 has passed as a first determination result 20, based on the magnetic signal 10 of the magnetic sensor 1. The detailed configuration in which the first determination unit 42 outputs the first determination result 20 will be described later. Note that whether or not the magnetic body 90 has passed means whether or not the magnetic body 90 has passed the vicinity of the magnetic sensor 1. In other words, whether or not the magnetic body 90 has passed means whether or not the magnetic body 90 has entered the region 91.

The second determination unit 43 is configured to output whether or not the magnetic body 90 has passed as a second determination result 21, after the output of the first determination result 20 by the first determination unit 42, based on the magnetic signal 10 of the magnetic sensor 1. Further, the second determination unit 43 is configured to have higher determination accuracy than the first determination unit 42. The detailed configuration in which the second determination unit 43 outputs the second determination result 21 will be described in later.

The determination result processing unit 44 is configured to display whether or not the magnetic body 90 has passed on the display unit 6, based on the first determination result 20, the second determination result 21. The detailed configuration in which the determination result processing unit 44 displays whether or not the magnetic body 90 has passed on the display unit 6 will be described later.

The storage unit 5 is configured to store the measurement data 22 acquired by the magnetic sensor 1. The measurement data 22 includes the position information 23 of the magnetic sensor 1, the time information 24 obtained the magnetic signal 10, and the magnetic signal 10. The storage unit 5 is configured to store various programs to be executed by the control unit 4, the signal detection determination program 25, a discriminator 26, standard waveform data 27, threshold data 28, and the like. Note that the position information 23 of the magnetic sensor 1 denotes the information of the position where the magnetic sensor 1 is disposed in the region 91. For example, the position information 23 includes the position coordinate where the magnetic sensor 1 is located. The storage unit 5 includes, for example, an HDD (Hard Disk Drive), a non-volatile memory, and the like.

The display unit 6 includes a determination result processing unit 44. The display unit 6 is configured to display (output) the first determination result 20 and the second determination result 21. The display unit 6 includes, for example, a processing device (arithmetic unit), such as, e.g., a personal computer provided with a liquid crystal display, a CPU, a ROM (Read Only Memory), and a RAM (Random Access Memory). The detailed configuration in which the display unit 6 displays the first determination result 20 and the second determination result 21 will be described later.

(Magnetic Signal)

Figure 3:
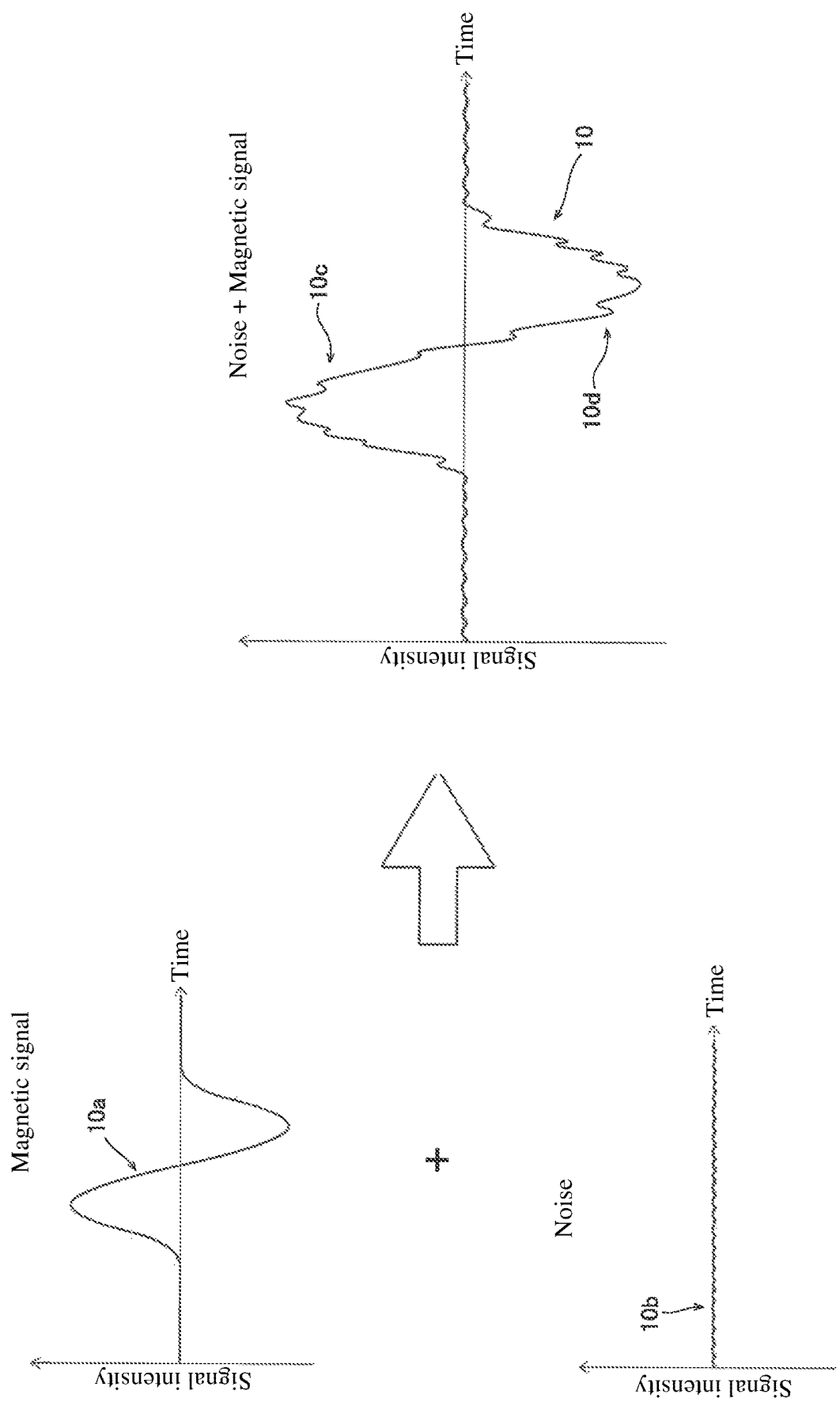
FIG. 3 is a schematic diagram of a magnetic signal obtained by a magnetic detection system according to one embodiment.

Next, referring to FIG. 3, the magnetic signal 10 acquired by the magnetic sensor 1 will be described. The magnetic signal 10 acquired by the magnetic sensor 1 includes a signal 10a due to the magnetic body 90 (detection target) and a steady noise 10b. Specifically, the magnetic signal 10 can be expressed as the sum of the signal 20a caused by the magnetic body 90 and the steady noise 10b. In this embodiment, as the magnetic signal 10 acquired by the magnetic sensor 1, an example including a first peak 10c and a second peak 10d is shown. Note that in each of the graphs shown in FIG. 3, the horizontal axis denotes the time, and the vertical axis denotes the signal intensity. In the embodiment shown in FIG. 3, the magnetic signal 10 includes the first peak 10c of a positive value and the second peak 10d of the negative value, but the magnetic signal 10 may include the first peak 10c of a negative value and the second peak 10d of a positive value.

(Generation of Signal Waveform)

Next, referring to FIG. 4 and FIG. 5, a configuration in which the signal waveform generation unit 41 generates the signal waveform 11 will be described. In this embodiment, the signal waveform generation unit 41 is configured to generate a signal waveform 11 by delimiting the time-series magnetic signal 10 by a prescribed time 70. The signal waveform generation unit 41 is configured to be able to generate signal waveforms 11 for various periods by changing the position to be delimited by the prescribed time 70. In this embodiment, the signal waveform generation unit 41 is configured to initiate the generation of the signal waveform 11 based on the magnetic signal 10 and the threshold data 28. Specifically, the signal waveform generation unit 41 is configured to initiate the generation of the signal waveform 11 when the magnetic signal 10 exceeds the threshold.

Figure 4:
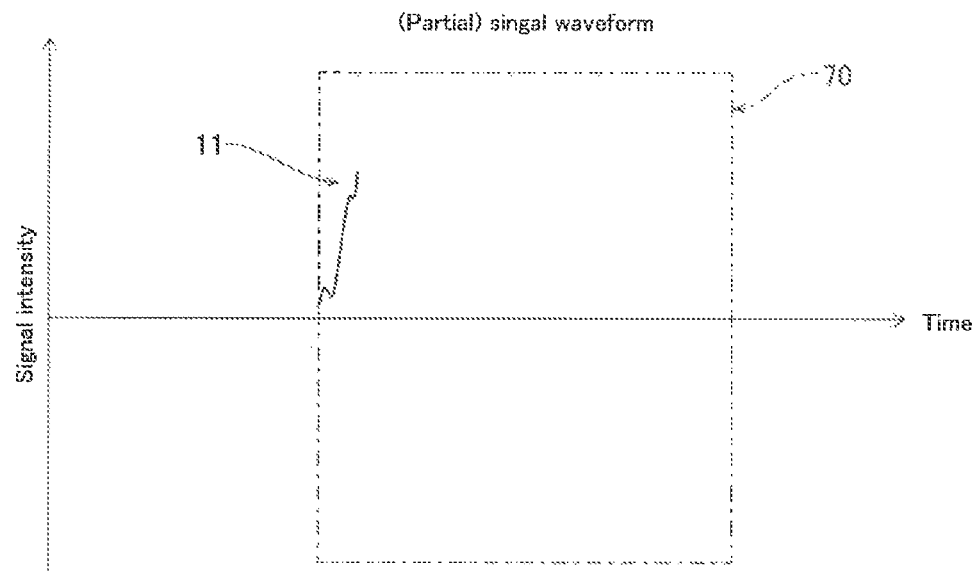
FIG. 4 is a schematic diagram of a signal waveform based on a part of a magnetic signal generated by a signal waveform generation unit.

The example shown in FIG. 4 shows a signal waveform 11 in a state prior to the elapse of a predetermined time after starting the generation of the signal waveform 11. The signal waveform generation unit 41 generates, after starting the generation of the signal waveform 11, a signal waveform 11 each time the magnetic signal 10 is acquired in accordance with a sampling period. The example shown in FIG. 4 is a signal waveform 11 in a state in which a part of the first peak 10c included in the magnetic signal 10 is included in the signal waveform 11.

Figure 5:
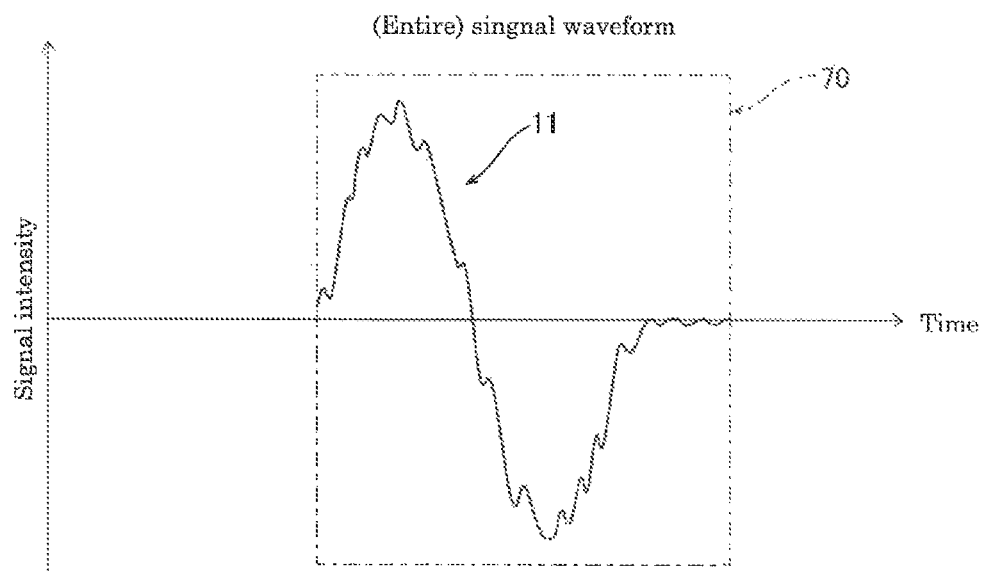
FIG. 5 is a schematic diagram of an entire waveform of a signal waveform generated by a signal waveform generation unit.

The example shown in FIG. 5 shows the entire waveform of the signal waveform 11 after the prescribed time 70 has elapsed. In the example shown in FIG. 5, since the prescribed time 70 has elapsed, all the peaks (the first peak 10c and the second peak 10d) included in the magnetic signal 10 are included in the signal waveform 11.

Note that in this embodiment, the magnetic sensor 1 is configured to acquire a time-series magnetic signal 10 by the predetermined sampling period. The predetermined sampling duration is determined by the maximum value of the moving speed of the magnetic body 90, which is a detection target. Specifically, the predetermined sampling period is set such that a value capable of reproducing the magnetic signal 10 having the same frequency as the frequency (the maximum frequency f) of the magnetic signal 10 acquired from the magnetic body 90 moving at the maximum value of the moving speed which is set as the detectable upper limit value is set as a sampling period based on the sampling theorem. Specifically, the predetermined sampling period is a value greater than twice the maximum frequency f.

In this embodiment, the prescribed time 70 is determined based on the smallest value of the moving speed of the magnetic body 90, which is a detection target. The prescribed time 70 is determined by the following expression (1):

$$p = \frac{\sqrt[3]{T}}{V} \times 2 \tag{1}$$

where p is a prescribed time (sec). T is the magnitude (nT: nanotesla) of the magnetism emitted by the magnetic body 90. V is the smallest value of the moving speed of the magnetic body 90 (m/s).

(First Determination Unit)

In this embodiment, the first determination unit 42 is configured to output the first determination result 20 by determining the magnetic signal 10 based on a predetermined condition. Specifically, the first determination unit 42 is configured to output the first determination result 20 using the signal detection determination program 25 stored in the storage unit 5.

The first determination unit 42 is configured to output the first determination result 20 based at least in a part of the magnetic signal 10 after the prescribed time 70 has elapsed. In this embodiment, the first determination unit 42 is configured to output the first determination result 20 based on at least a part of the magnetic signal 10 and the standard waveform data 27 stored in the storage unit 5 after the prescribed time 70 has elapsed.

(Standard Waveform)

Figure 6:
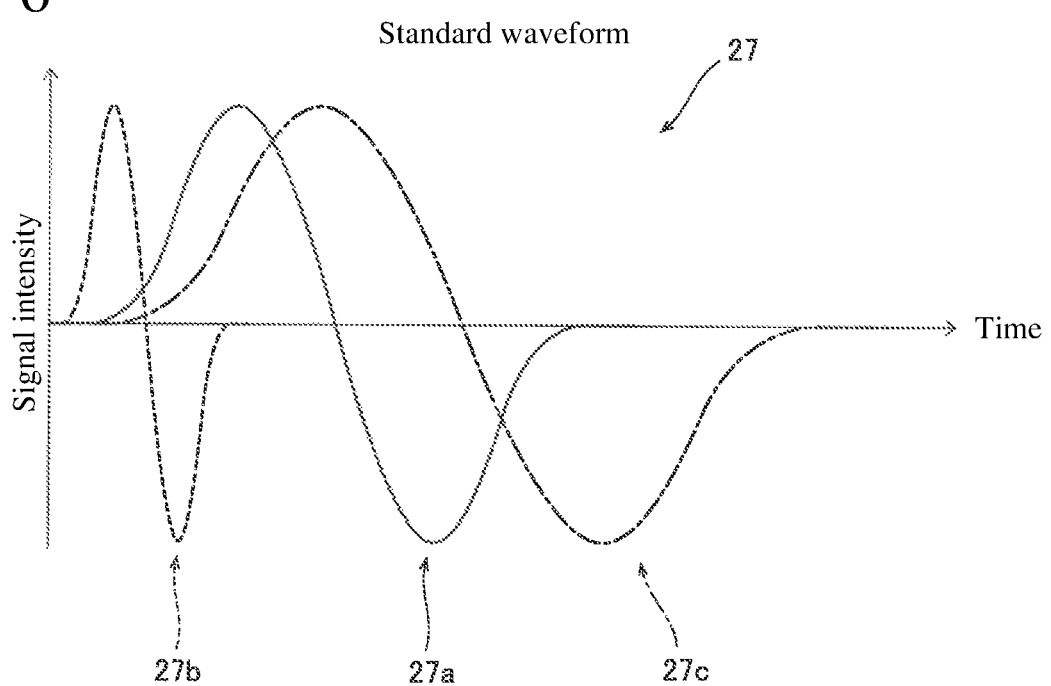
FIG. 6 is a schematic diagram of a standard waveform used for a magnetic detection system according to one embodiment.

FIG. 6 is a schematic diagram of the standard waveform data 27. In the standard waveform data 27 shown in FIG. 6, the horizontal axis denotes the time, and the vertical axis denotes the signal intensity. In this embodiment, the storage unit 5 stores, for example, first standard waveform data 27a, second standard waveform data 27b, and third standard waveform data 27c. The first standard waveform data 27a, the second standard waveform data 27b, and the third standard waveform data 27c are waveform data the same in the signal intensity and different in the period. The second standard waveform data 27b has a period smaller than that of the first standard waveform data 27a. The third standard waveform data 27c has a period larger than that of the first standard waveform data 27a.

The first determination unit 42 is configured to sequentially output the first determination result 20 based on whether or not at least a part of the shape of the signal waveform 11 is a predetermined shape as a predetermined condition after the prescribed time 70 has elapsed. Specifically, the first determination unit 42 calculates the statistic, such as, e.g., the similarity degree of the shape between the standard waveform data 27 stored in the storage unit 5 and the signal waveform 11 and the change amount of the signal waveform 11. The first determination unit 42 is configured to output the first determination result 20 based on the calculated statistic and the threshold data 28.

In this embodiment, the first determination unit 42 is configured to output a first detection flag 20a as the first determination result 20. The first detection flag 20a is a value indicating whether or not the magnetic body 90 has passed. Specifically, the first detection flag 20a is a numerical value of 0 or 1. When detecting that the magnetic body 90 has passed, the first determination unit 42 outputs 1 as the first detection flag 20a. When not detecting that the magnetic body 90 has passed, the first determination unit 42 outputs 0 as the first detection flag 20a.

(Second Determination Unit)

In this embodiment, the second determination unit 43 is configured to output the second determination result 21 based on the discriminator 26 trained by machine learning. For example, as the way of training the discriminator 26, a neural network, a support vector machine, or the like is used.

The discriminator 26 has been trained using a simulation waveform generated by simulating the magnetic signal 10 emitted from the magnetic body 90 and the measured noise waveform. The simulation waveform is used for learning with the noise waveforms superimposed. In addition, the simulation waveform is waveform data exhaustively generated by setting a plurality of parameters to various values. The multiple parameters include, for example, the transverse magnetism of the magnetic body 90, the fore-and-aft direction magnetism of the magnetic body 90, the perpendicular magnetism of the magnetic body 90, the traveling direction of the magnetic body 90, the traveling speed of the magnetic body 90, the underwater depth of the magnetic body 90, the transverse distance (distance in the transverse direction), etc. Note that the simulation waveform is generated by simulating the waveform of the magnetic signal 10 when the magnetic body 90 has completely passed.

The second determination unit 43 is configured to output the second determination result 21 based on the magnetic signal 10 after the prescribed time 70 has elapsed. Specifically, the second determination unit 43 is configured to output the second determination result 21 after the prescribed time 70 has elapsed, based on the entire waveform of the signal waveform 11 (see FIG. 5). The second determination unit 43 is configured to output the second determination result 21 based on the signal waveform 11 and the discriminator 26. Specifically, the second determination unit 43 outputs the second determination result 21 based on the accuracy of whether or not the magnetic body 90 has passed output by the discriminator 26 and the threshold data 28. Note that the accuracy of whether or not the magnetic body 90 has passed is a value indicating that the magnetic signal 10 is a signal caused by the passage of the magnetic body 90. Specifically, the accuracy of whether or not the magnetic body 90 has passed is a number between 0 and 1, which means that the closer it is to 1, the higher the probability that the magnetic signal 10 is the signal resulting from the passage of the magnetic body 90.

The second determination unit 43 is configured to output a second detection flag 21a as the second determination result 21. The second detection flag 21a is a value indicating whether or not the magnetic body 90 has passed. Specifically, the second detection flag 21a is a numerical value of 0 or 1. When detecting that the magnetic body 90 has passed, the second determination unit 43 outputs 1 as the second detection flag 21a. When not detecting that the magnetic body 90 has passed, the second determination unit 43 outputs 0 as the second detection flag 21a.

(Display of Determination Result)

The determination result processing unit 44 is configured to make the display unit 6 display whether or not the magnetic body 90 has passed, based on the first detection flag 20a and the second detection flag 21a.

Figure 7:
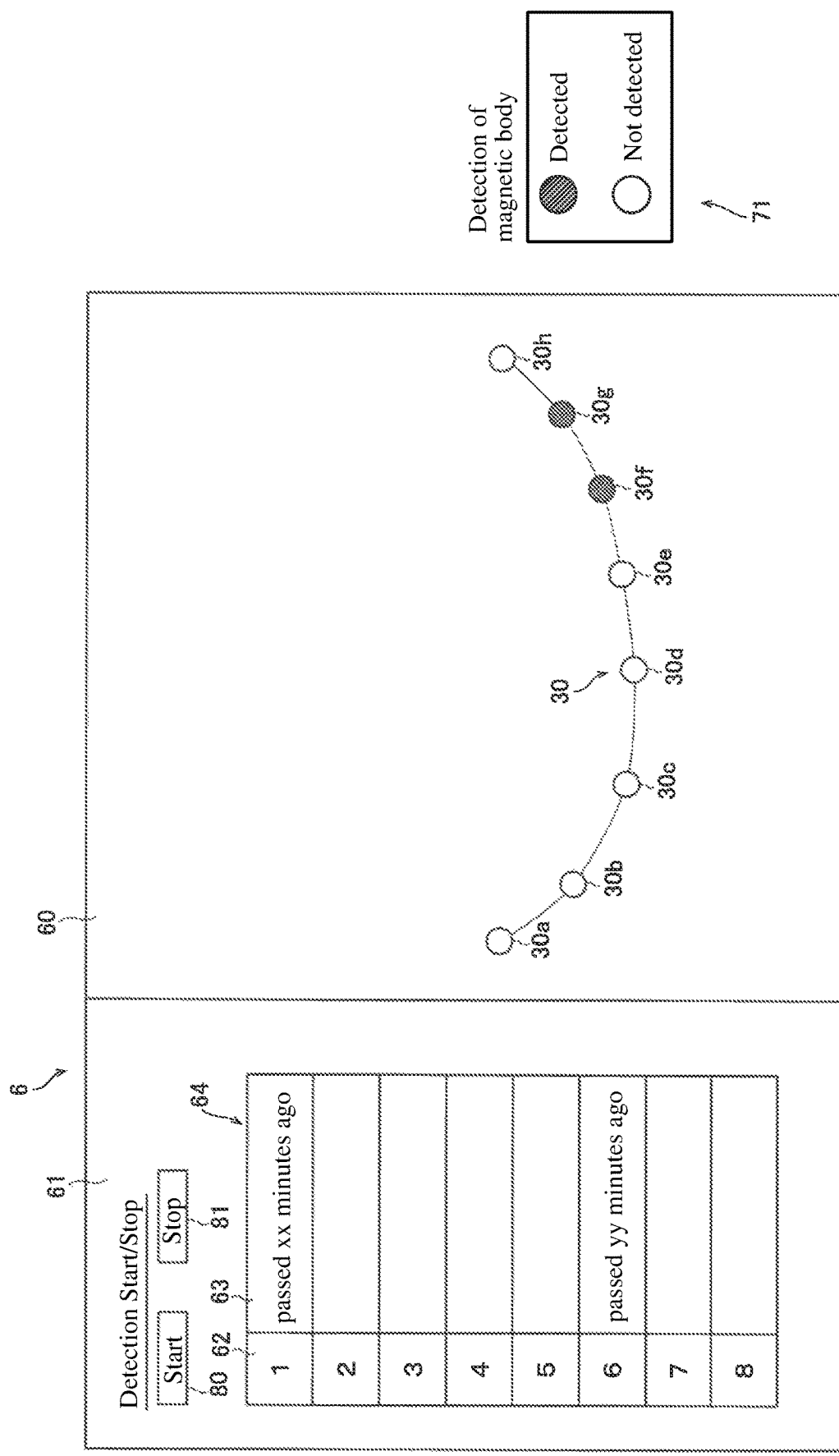
FIG. 7 is a schematic diagram of a determination result displayed on a display unit of a magnetic detection system according to an embodiment.

FIG. 7 is a schematic view of the display unit 6 on which the first determination result 20 and the second determination result 21 are displayed. A first display area 60 and a second display area 61 are displayed on the display unit 6. The first display area 60 is an area in which the first determination result 20 is displayed. The second display area 61 is an area in which the second determination result 21 is displayed.

In this embodiment, the determination result processing unit 44 is configured to make the display unit 6 display whether or not the magnetic body 90 has passed in the region 91 based on the first determination result 20, the second determination result 21, and the position information 23 of the magnetic sensor 1. Specifically, as shown in FIG. 7, in the first display area 60, a map of the region 91 in which a plurality of magnetic sensors 1 is disposed is displayed. The determination result processing unit 44 illustrates a plurality of icons 30 each indicating the magnetic sensor 1 on the map, based on the position information 23 of each magnetic sensor 1. Since eight magnetic sensors 1 are provided in this embodiment, the first display area 60 includes a first icon 30a, a second icon 30b, a third icon 30c, a fourth icon 30d, a fifth icon 30e, a sixth icon 30f, a seventh icon 30g, and an eighth icon 30h.

In this embodiment, the determination result processing unit 44 is configured to display whether or not the magnetic body 90 has passed by the display unit 6 by the change of the display mode, based on the first detection flag 20a and the second detection flag 21a. For example, the determination result processing unit 44 changes the color of the icon 30 displayed in the first display area 60 to indicate whether or not the magnetic body 90 has passed. In the example shown in FIG. 7, the change in the display mode (the change in the color of the icon 30) is illustrated by the presence or absence of hatching. Specifically, as shown in the legend 71, the change of the display mode (the change of the color of the icon 30) is illustrated by changing the hatching according to the values of the first detection flag 20a and the second detection flag 21a.

In the case shown in FIG. 7, the display mode of the sixth icon 30f and the display mode of the seventh icon 30g are changed. Thus, the monitoring person can determine that the magnetic body 90 is passing between the sixth magnetic sensor 1f and the seventh magnetic sensor 1g.

The second display area 61 displays a table 64 including a column 62 for displaying IDs allocated to the respective magnetic sensors 1 and a column 63 for displaying whether or not the magnetic body 90 has passed. In this embodiment, since eight magnetic sensors 1 are arranged, in the column 62, 1 to 8 are displayed as IDs of the magnetic sensors 1. The determination result processing unit 44 is configured to display the time information 24 about the completion of the passage of the magnetic body 90 on the display unit 6 when the second detection flag 21a is 1. Further, the determination result processing unit 44 is configured to display the time information 24 about the completion of the passage of the magnetic body 90 by the display unit 6. In this embodiment, the determination result processing unit 44 is configured to indicate how many minutes has elapsed after the completion of the passage of the magnetic body 90 as the time information 24.

Further, the determination accuracy of the second determination unit 43 is configured to be higher than the determination accuracy of the first determination unit 42. Specifically, the second determination unit 43 is configured to be higher in the determination accuracy than the determination accuracy of the first determination unit 42 by performing the determination using the discriminator 26 trained to be higher in the determination accuracy than the first determination unit 42. Therefore, the passage of the magnetic body 90 that cannot be detected by the first determination unit 42 can be detected by the second determination unit 43. In the example of the embodiment shown in FIG. 7, it is detected by the second determination unit 43 that the magnetic body 90 has passed the vicinity of the first magnetic sensor 1*a*.

The second display area 61 is provided with a start button 80 and a stop button 81. The start button 80 is configured to be operable to initiate the detection of the passage of the magnetic body 90. The stop button 81 is configured to accept an operation of stopping the detection of the passage of the magnetic body 90. When the monitoring person presses the start button 80, the magnetic detection system 100 starts to detect whether or not the magnetic body 90 has passed. Further, when the monitoring person presses the stop button 81, the detection of whether or not the magnetic body 90 has passed by the magnetic detection system 100 is stopped.

Figure 8:
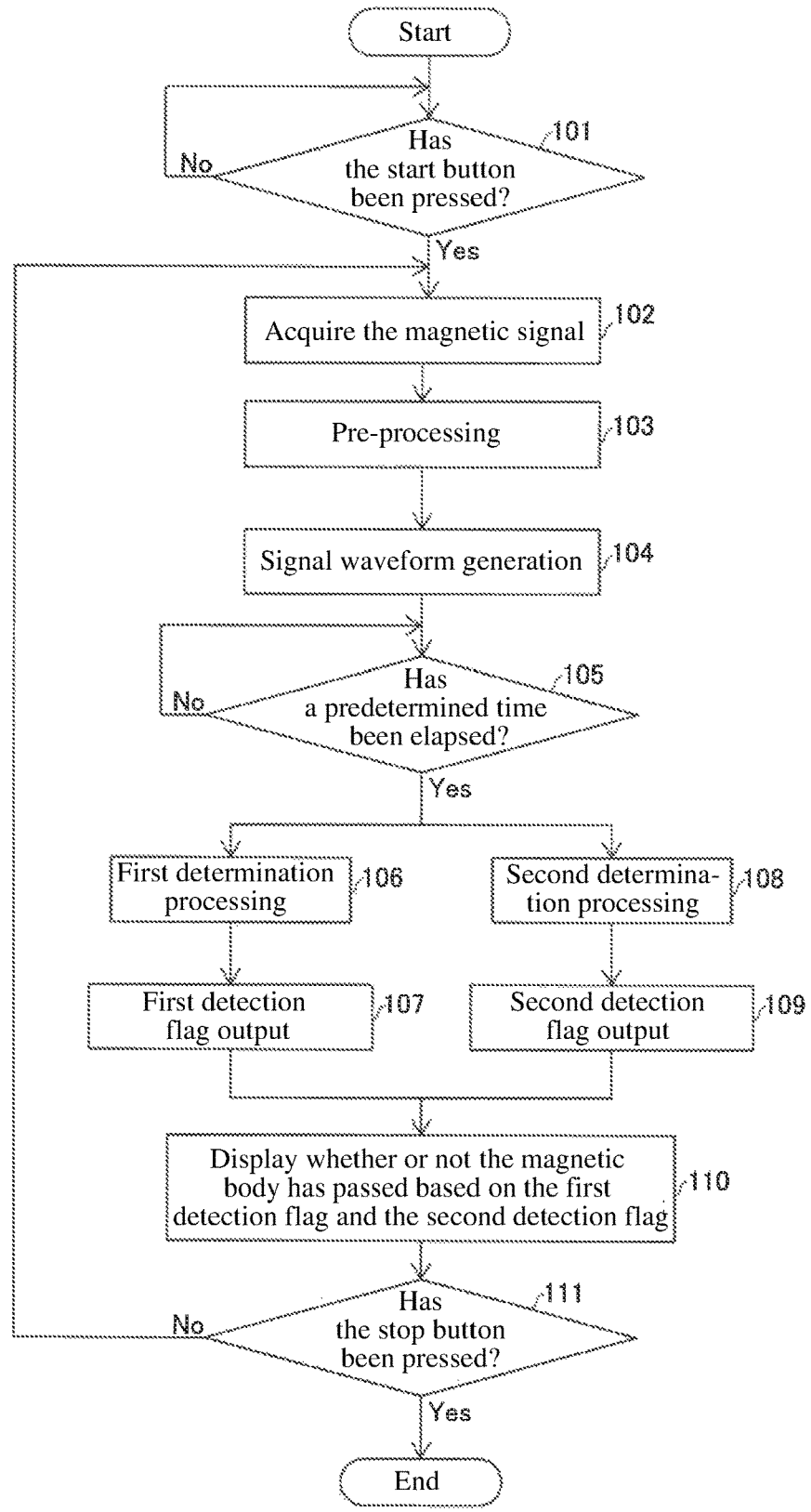
FIG. 8 is a flowchart illustrating a process for displaying a first determination result and a second determination result.

Next, referring to FIG. 8, the flow of the displaying processes of the first determination result 20 and the second determination result 21 will be described.

In Step 101, the control unit 4 determines whether or not the start button 80 has been pressed. When the start button 80 has not been pressed, the process of Step 101 is repeated. When the start button 80 is pressed, the process proceeds to Step 102.

In Step 102, the control unit 4 acquires the magnetic signal 10 from the magnetic sensor 1 through the receiving unit 2. For example, in Step 102, the control unit 4 acquires the position information 23 of the magnetic sensor 1 and the time information 24 when the magnetic signal 10 is obtained.

Further, in Step 102, the control unit 4 performs control for storing the magnetic signal 10 in the storage unit 5. The control unit 4 performs control to store the magnetic signal 10, the position information 23, and the time information 24 in the storage unit 5 as measurement data 22.

In Step 103, the pre-processing unit 40 performs pre-processing for the magnetic signal 10. Specifically, the pre-processing unit 40 performs, with respect to the magnetic signal 10, a geomagnetic orthogonal coordinate transformation processing, a background magnetic field compensating processing, a total magnetic force calculation processing, a low-pass filter processing, and a high-pass filter processing.

The geomagnetic orthogonal coordinate transformation processing is a process of unifying the posture (direction) that each magnetic sensor 1 is placed by converting in one direction. Further, the background magnetic field compensation processing is a process of acquiring only the magnetic variation due to the magnetic body 90 by placing a compensation sensor (not shown) for acquiring the ambient environmental noise at a place where it is less susceptible to the magnetic body 90 and removing the environmental noise acquired by the compensation sensor from the magnetic signal 10 of the respective magnetic sensors 1. Further, the total magnetic force calculation processing is a process of obtaining the total magnetic force obtained by synthesizing the magnetic forces in the three axial directions of the vertical direction (Z-direction) and two directions (X-direction and Y-direction) perpendicular to each other in a plane perpendicular to the Z-direction. The low-pass filter processing is a process of removing high-frequency noise components from the magnetic signal 10 by applying a low-pass filter to the magnetic signal 10. Further, the high-pass filter processing is a process of removing DC components from the magnetic signal 10 by applying a high-pass filter to the magnetic signal 10.

In Step 104, the signal waveform generation unit 41 generates a signal waveform 11 based on the magnetic signal 10 stored in the storage unit 5.

In Step 105, the control unit 4 determines whether or not the prescribed time 70 has elapsed. When the prescribed time 70 has elapsed, the process proceeds to Step 106 and Step 108. When the prescribed time 70 has not elapsed, the process repeats the process of Step 105.

In Step 106, the first determination unit 42 performs the first determination processing. The first determination unit 42 acquires the first detection flag 20*a* as the first determination process. Specifically, the first determination unit 42 acquires the first detection flag 20*a* based on the signal waveform 11 and the standard waveform data 27.

In Step 107, the first determination unit 42 outputs the acquired first detection flag 20*a* to the determination result processing unit 44.

In Step 108, the second determination unit 43 performs the second determination process. The second determination unit 43 acquires the second detection flag 21*a* as the second determination processing. Specifically, the second determination unit 43 acquires the second detection flag 21*a* based on the signal waveform 11 and the discriminator 26.

In Step 109, the second determination unit 43 outputs the acquired second detection flag 21*a* to the determination result processing unit 44.

In Step 110, the determination result processing unit 44 displays whether or not the magnetic body 90 has passed on the display unit 6 by changing the display mode based on the first detection flag 20*a* and the second detection flag 21*a*.

In Step 111, the control unit 4 determines whether or not the stop button 81 has been pressed. When the stop button 81 has not been pressed, the process proceeds to Step 102. When the stop button 81 is pressed, the process ends.

In this embodiment, the first determination process and the second determination process by the first determination unit 42 and the second determination unit 43 are sequentially performed every predetermined sampling period after the prescribed time 70 has elapsed since the generation of the signal waveform 11 was started. The first determination result 20 (first detection flag 20*a*) is also displayed every predetermined sampling period. That is, the first determination process by the first determination unit 42, the display of the first determination result 20 (first detection flag 20*a*), the second determination processing by the second determination unit 43, and the display of the second determination result 21 (second detection flag 21*a*) are performed as parallel processing.

Effects of this Embodiment

In this embodiment, the following effects can be obtained.

In this embodiment, as described above, the magnetic detection system 100 is provided with: the magnetic sensor 1 configured to be installed underwater to acquire the magnetic signal 10; the storage unit 5 configured to store the magnetic signal 10 acquired by the magnetic sensor 1; the first determination unit 42 configured to output whether or not a magnetic body 90 has passed as the first determination result 20 based on the magnetic signal 10 of the magnetic sensor 1; the second determination unit 43 configured to output whether or not the magnetic body 90 has passed as the second determination result 21 based on the magnetic signal 10 of the magnetic sensor 1 after an output of the first determination result 20 by the first determination unit 42; and the display unit 6 configured to display (output) the first determination result 20 and the second determination result 21, wherein the second determination unit 43 is configured to have higher determination accuracy than the first determination unit 42.

As a result, the first determination result 20 and the second determination result 21, which differ in the output timing and the determination accuracy, are displayed (output), so that the monitoring person can determine whether or not the magnetic body 90 has passed based on the first determination result 20, which is earlier in the output timing, and the second determination result 21, which is higher in the determination accuracy than the first determination result 20. Further, since the first determination result 20 and the second determination result 21 indicating whether or not the magnetic body 90 has passed are outputted. Therefore, as compared with the configuration in which the monitoring person confirms whether or not it is a magnetic signal 10 due to the magnetic body 90 by directly confirming the magnetic signal 10, it is possible to reduce the burden on the monitoring person. Consequently, it is possible to provide the magnetic detection system 100 capable of reducing the burden on the monitoring person while ensuring immediacy and determination accuracy.

In this embodiment, as described above, the first determination unit 42 is configured to output the first determination result 20 by discriminating the magnetic signal 10 based on the predetermined condition, and the second determination unit 43 is configured to output the second determination result 21 based on the discriminator 26 trained by machine learning.

As a result, even in the case of a magnetic signal from which the first determination unit 42 cannot perform the determination, it is possible to perform the determination by the discriminator 26 trained by machine learning. As a result, the second determination unit 43 having higher determination accuracy than the first determination unit 42 can be easily provided.

In this embodiment, as described above, the magnetic sensor 1 is configured to acquire the time-series magnetic signal 10 with the predetermined sampling period. The first determination unit 42 is configured to output the first determination result 20 based on at least a part of the magnetic signal 10 after the prescribed time 70 has elapsed. The second determination unit 43 is configured to output the second determination result 21 based on the magnetic signal 10 after the prescribed time 70 has elapsed.

With this, since the first determination result 20 is output based on the part of the magnetic signal 10, it is possible to output a highly immediate result. Further, since the second determination result 21 is output based on the magnetic signal 10 after the prescribed time 70 has elapsed, it is possible to output a highly reliable result. As a result, the immediacy can be ensured by the first determination result 20, and the determination accuracy can be ensured by the second determination result 21.

Further, in this embodiment, as described above, the magnetic detection system further includes: the signal waveform generation unit 41 configured to generate the signal waveform 11 by delimiting the time-series magnetic signal 10 by the prescribed time 70. The first determination unit 42 is configured to sequentially output the first determination result 20 based on whether or not at least the part of the shape of the signal waveform 11 is a predetermined shape as the predetermined condition after the prescribed time has elapsed. The second determination unit 43 is configured to output the second determination result 21 based on the entire waveform of the signal waveform 11 after the prescribed time has elapsed.

With this, it is possible to output a highly immediate result by the first determination unit 42. Further, it is possible to output a highly accurate determination result by the second determination unit 43. As a result, it is possible to provide the monitoring person with the result capable of complementing the immediacy and the accuracy with each other.

Further, in this embodiment, as described above, the system further includes: the determination result processing unit 44 for notifying the display unit 6 (notification unit) of whether or not the magnetic body 90 has passed based on the first determination result 20 and the second determination result 21. The first determination unit 42 is configured to output, as the first determination result 20, the first detection flag 20a which is a value indicating whether or not the magnetic body 90 has passed. The second determination unit 43 is configured to output, as the second determination result 21, the second detection flag 21a which is a value indicating whether or not the magnetic body 90 has passed. The determination result processing unit 44 is configured to display (notify) whether or not the magnetic body 90 has passed by the display unit 6 based on the first detection flag 20a and the second detection flag 21a.

With this, whether or not the magnetic body 90 has passed can be grasped by the first detection flag 20a having high immediacy and the second detection flag 21a having high accuracy. Consequently, for example, unlike the configuration in which whether or not the magnetic body 90 has passed is determined based on the signal waveform 11, it is possible to determine whether or not the magnetic body 90 has passed by the first detection flag 20a and the second detection flag 21a, regardless of the proficiency of the monitoring person, it is possible to determine whether or not the magnetic body 90 has passed with high accuracy.

In this embodiment, as described above, the determination result processing unit 44 is configured to display (notify) whether or not the magnetic body 90 has passed by the display unit 6 according to the change of the notification mode based on the first detection flag 20a and the second detection flag 21a.

With this, the change of the first detection flag 20a with high immediacy can be easily visually grasped in real-time, and the passing time of the magnetic body 90 can be grasped based on the second detection flag 21a with high certainty. As a result, it is possible to more accurately determine whether or not the magnetic body 90 has passed, regardless of the proficiency of the monitoring person.

Further, in this embodiment, as described above, a plurality of the magnetic sensors 1 is installed in the region 91 for detecting the passage of the magnetic body 90. The determination result processing unit 44 is configured to make the display unit 6 display (notify) whether or not the magnetic body 90 has passed in the region 91 based on the first determination result 20 and the second determination result 21, and the position information 23 of the magnetic sensor 1.

With this, the monitoring person can visually grasp whether or not the magnetic body 90 has passed and the position at which the magnetic body 90 is passing.

Further, in this embodiment, as described above, the notification unit includes the display unit 6 that displays the first determination result 20 and the second determination result 21 on the same screen. With this, the first determination result 20 and the second determination result 21 can be grasped at the same time. As a result, the first determination result 20 having immediacy and the second determination result 21 having higher determination accuracy can be grasped at a time. Therefore, the convenience of the monitoring person can be improved.

Further, in this embodiment, as described above, the predetermined sampling period is determined based on the maximum value of the moving speed of the magnetic body 90, which is a detection target, and the prescribed time 70 is determined based on the minimum value of the moving speed. By determining the predetermined sampling period based on the maximum value of the moving speed of the magnetic body 90, even in cases where the magnetic signal 10 is abruptly changed, it is possible to acquire the peak of the magnetic signal 10. Further, by obtaining the prescribed time 70 based on the minimum value of the moving speed, when acquiring the signal waveform 11, it is possible to suppress all peaks included in the magnetic signal 10 (the first peak 10c and the second peak 10d) are not included in the signal waveform 11. As a consequence, the magnetic signal 10 can be acquired accurately, thereby improving the reliability of the magnetic detection system 100.

Modifications

It should be understood that the embodiments disclosed here are examples in all respects and are not restrictive. The scope of the present invention is shown by the scope of the claims rather than the descriptions of the embodiments described above, and includes all changes (modifications) within the meaning of equivalent and the scope of claims.

For example, in the above-described embodiment, an example of a configuration in which only the magnetic sensor 1 is displayed in the first display area 60 is shown, but the present invention is not limited thereto. For example, as in the magnetic detection system 200 according to a first modification shown in FIG. 9, it may be configured such that in the first display area 60, the magnetic sensor 1, and the land 92 (see FIG. 10) and the sea 93 are displayed on the map 94 in a distinguishable manner.

The magnetic detection system 200 according to the first modification differs from the magnetic detection system 100 according to the above-described embodiment in that it includes a control unit 14 instead of the control unit 4.

Figure 10:
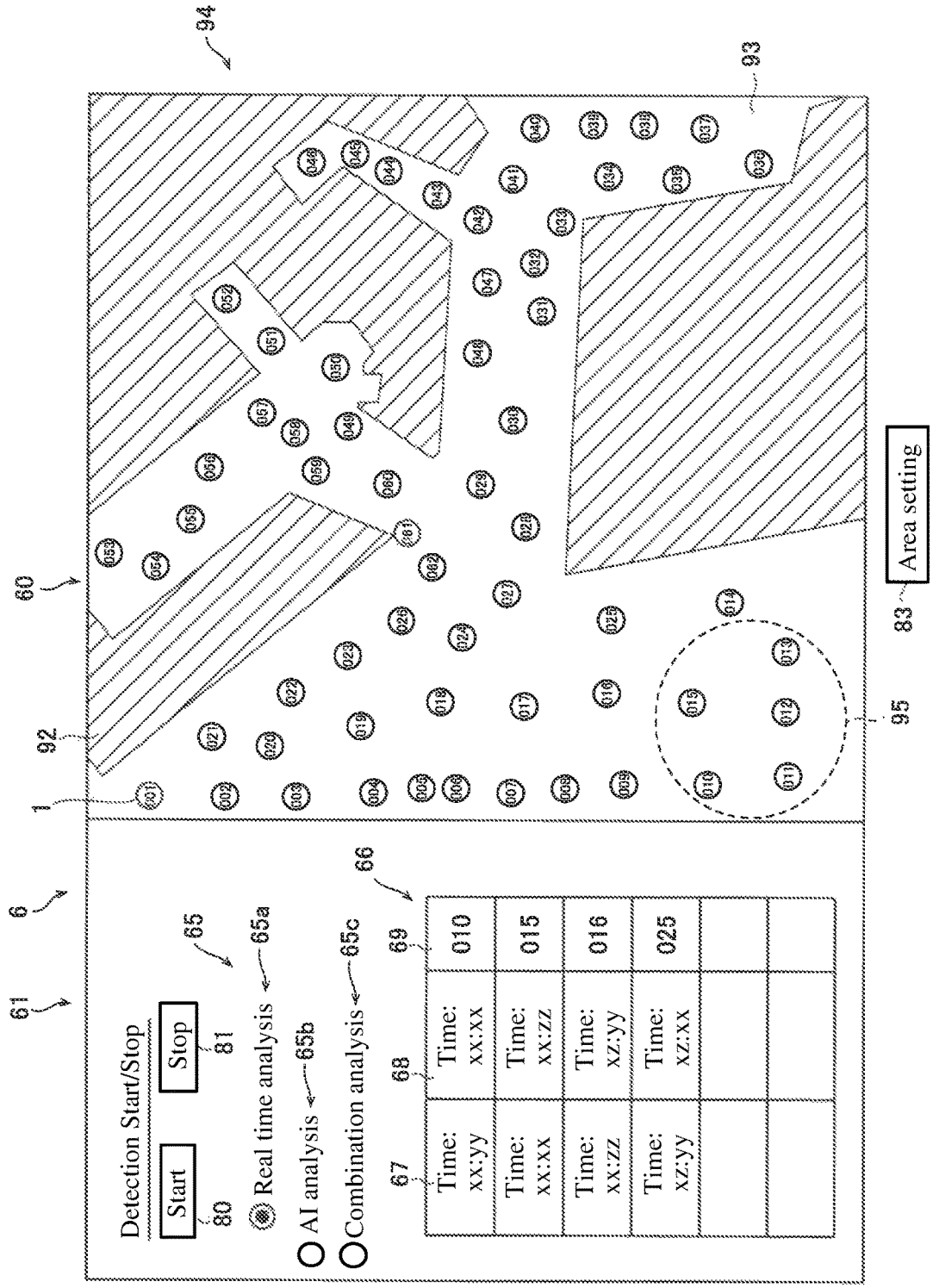
FIG. 10 is a schematic diagram of a determination result displayed on a display unit of a magnetic detection system according to the first modification.

As shown in FIG. 10, in the first display area 60, the control unit 14 according to the first modification is configured to display a map 94 which shows the land 92 and the sea 93 in a distinguishable manner. In addition, the control unit 14 is configured to display the magnetic sensor 1 in the map 94 which shows the land 92 and the sea 93 distinguishably.

Note that the magnetic sensors 1 are installed in the region of the sea 93 on the map. With this configuration, since the magnetic sensor 1 is displayed on the map 94 in which the land 92 and the sea 93 are displayed, the user can easily grasp the positional relation between the position of the magnetic sensor 1 and the land 92. As a result, the user can easily grasp the moving condition of the magnetic body 90 approaching the land 92.

Further, as shown in FIG. 10, the control unit 14 according to the first modification is configured to display the sensor number 12 (see FIG. 9) unique for each magnetic sensor 1 so as to be superimposed on the magnetic sensor 1 when the magnetic sensor 1 is displayed in the first display area 60. Note that, in FIG. 10, an example showing the sensor number 12 inside the magnetic sensor 1 is shown.

That is, the number, such as, e.g., "001" and "002" displayed inside the magnetic sensor 1, is the sensor number 12.

With this configuration, in the first display area 60, since the magnetic sensor 1 unique for each sensor number 12 is displayed, in the second display area 61, when displaying whether or not the magnetic body 90 has passed, by displaying the sensor number 12 together, the position of the magnetic sensor 1 and the detection result by the magnetic sensor 1 can be displayed in association by the sensor number 12. As a result, the user can easily grasp the respective magnetic sensors 1 displayed on the first display area 60 and the information of whether or not the magnetic body 90 displayed in the second display area 61 has passed in an associated manner. Therefore, the user can more easily grasp whether or not the magnetic body 90 has passed.

Further, in the first modification, the control unit 14 is configured to store the position information of the sensor. Specifically, the control unit 14 is configured to store the position information 23 (see FIG. 9) of the position where the sensor is installed in association with the sensor number 12. Specifically, when placing the magnetic sensor 1, the latitude and the longitude of the point where the magnetic sensor 1 is placed are obtained by a GPS (Global Positioning System) or the like, and the latitude and the longitude obtained are stored in association with the sensor number 12.

Further, the control unit 14 is configured to display the magnetic sensor 1 based on the stored position information 23 and the sensor number 12, in the map 94 of the first display area 60 in a state in which the sensor number 12 is superimposed on the position coordinate corresponding to the position information 23.

Figure 9:
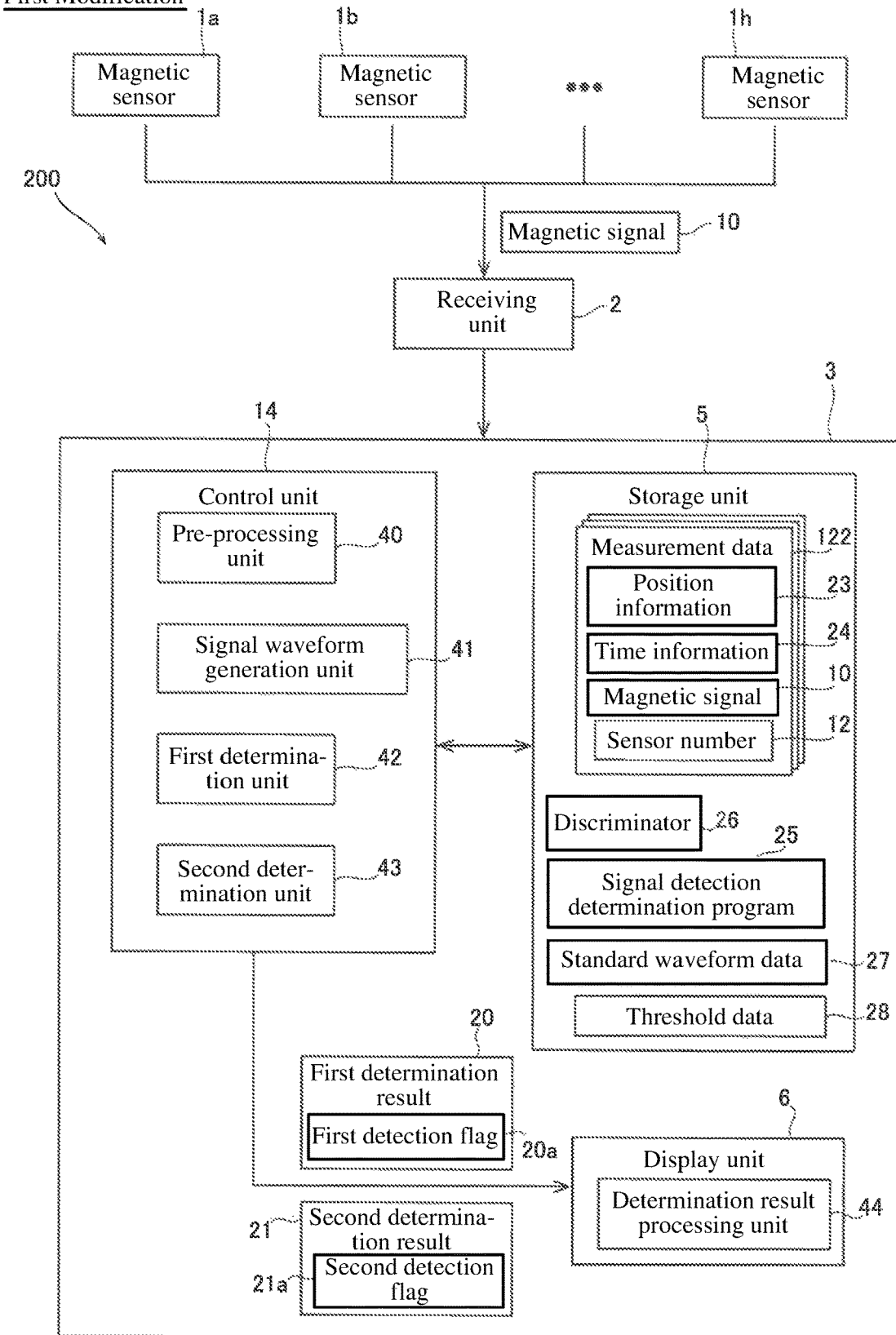
FIG. 9 is a block diagram showing a configuration of a magnetic detection system according to a first modification.

Further, as shown in FIG. 10, the control unit 14 according to the first modification is configured to display whether or not the magnetic body 90 has passed in time series on the basis of the first determination result 20 (see FIG. 9) and the second determination result 21 (see FIG. 9). Specifically, the control unit 14 is configured to display the table 66 showing whether or not the magnetic body 90 has passed in time series in the second display area 61. The table 66 includes a column 67 for displaying the time when the magnetic signal 10 emitted from the magnetic body 90 begins to be detected, a column 68 for displaying the time when the detection of the magnetic signal 10 emitted from the magnetic body 90 is completed, and a column 69 for displaying the sensor number 12 of the magnetic sensor 1.

The control unit 14 according to the first modification updates the table 66 every time the first determination result 20 and the second determination result 21 are output, and displays whether or not the magnetic body 90 has passed in time series. With this configuration, since whether or not the magnetic body 90 has passed is displayed in time series, by confirming the sensor number 12 together with the determination result, it is possible to easily grasp the moving path of the magnetic body 90.

Further, the control unit 14 according to the first modification is configured to be able to select a criterion for displaying the determination result. Specifically, as shown in FIG. 10, the control unit 14 is configured to display the criterion selection section 65 on the second display area 61. In the example shown in FIG. 10, the control unit 14 displays, as the criterion selection section 65, a real-time analysis option 65a, an AI analysis option 65b, and a combination analysis option 65c. When the user selects the real-time analysis option 65a, the control unit 14 displays only the first determination result 20. When the user selects the AI analysis option 65b, the control unit 14 displays only the second determination result 21. When the user selects the combination analysis option 65*c*, the control unit 14 is configured to display both the first determination result 20 and the second determination result 21.

With this arrangement, it is possible to display the immediate first determination result 20, the highly reliable second determination result 21, and the immediate and reliable decision based on the user's choice. As a result, the user can select the determination result to be confirmed by the user, thereby improving the convenience of the user.

Figure 11:
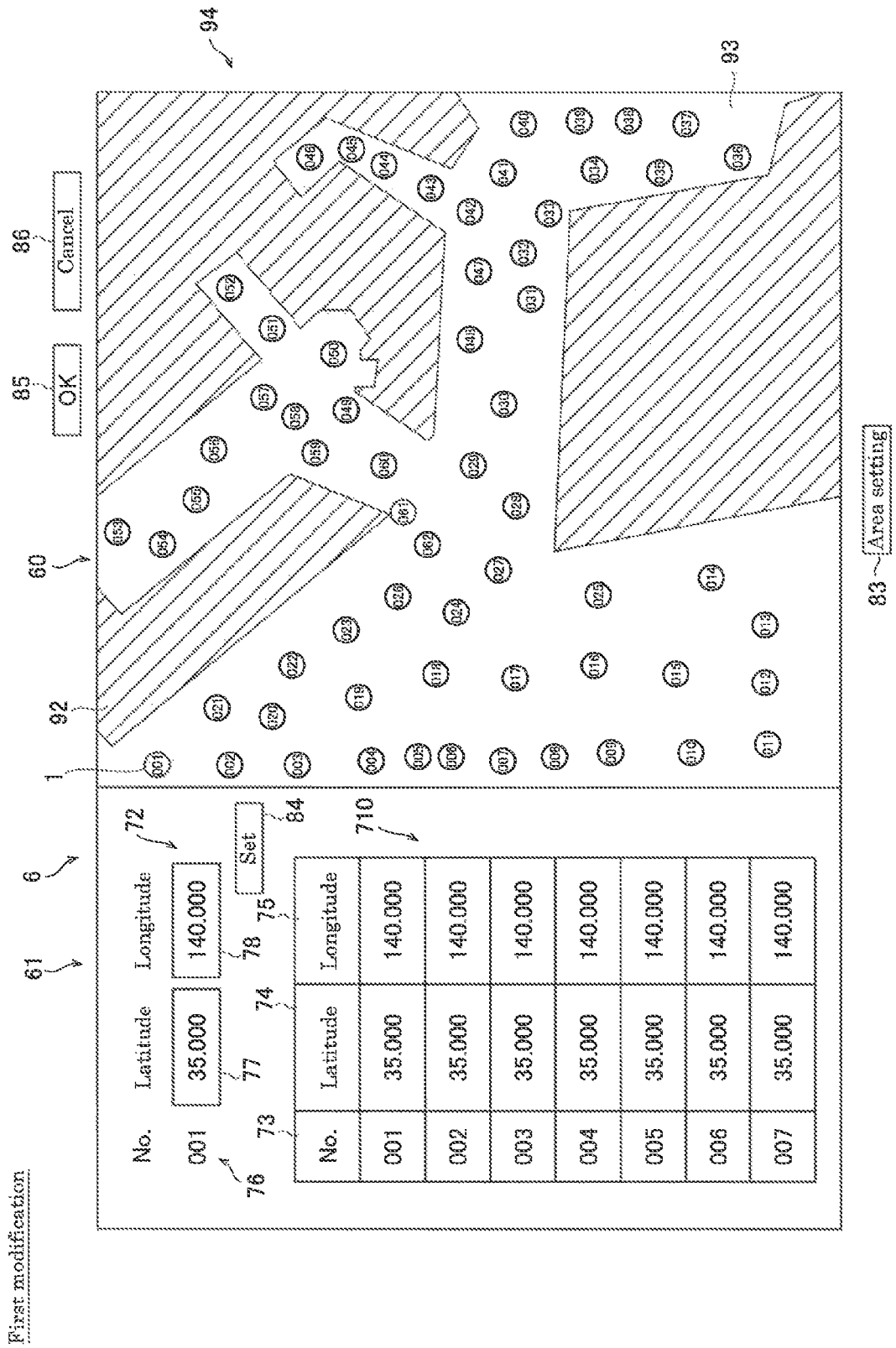
FIG. 11 is a schematic diagram of an area setting window displayed on a display unit of a magnetic detection system according to the first modification.

Further, the control unit 14 according to the first modification is configured such that the position information 23 of the magnetic sensor 1 can be changed. As shown in FIG. 10, the control unit 14 is configured to display an area setting button 83 in the display unit 6. When the area setting button 83 is pressed by the user, the control unit 14 displays an area setting mode screen (image) on the second display area 61 as shown in FIG. 11.

Specifically, the control unit 14 displays a table 710 and a setting field 72 in the second display area 61 as an area setting mode. The table 710 includes a column 73 showing the sensor number 12 of the magnetic sensor 1, a column 74 for displaying the latitude where the magnetic sensor 1 is placed, and a column 75 for displaying the longitude where the magnetic sensor 1 is placed. Further, in the setting field 72, a field 76 for displaying the sensor number 12 of the magnetic sensor 1, a latitude input field 77, a longitude input field 78, and a setting button 84 are displayed. In the example shown in FIG. 11, for the sake of convenience, the number of the position information 23 of the magnetic sensor 1 displayed in the table 710 is illustrated as seven, but seven or more position information 23 of the magnetic sensor 1 may be displayed. In this case, the table 711 may be displayed so as to be scrollable.

In the area setting mode, the sensor number 12 of the magnetic sensor 1 selected by the user among the magnetic sensors 1 displayed in the table 710 is displayed in the column 76. The position information 23 (latitude and longitude) of the magnetic sensor 1 selected by the user is displayed in the latitude input field 77 and the longitude input field 78. Note that it may be configured such that among the magnetic sensors 1 on the map 94 displayed in the first display area 60, the sensor number 12 and the position information 23 of the magnetic sensor 1 selected by the user are displayed in the setting field 72.

The user selects the magnetic sensor 1 in which the underwater position is actually moved, inputs the position information 23 (latitude and longitude) after the movement, and presses the setting button 84. With this, the control unit 14 updates the latitude and the longitude of the table 710 in accordance with the values input to the latitude input field 77 and the longitude input field 78. In the area setting mode, as shown in FIG. 11, the control unit 14 displays the OK button 85 and the cancel button 86 on the outer side of the first display area 60.

When the OK button 85 is pressed, the control unit 14 stores the position information 23 of the respective magnetic sensors 1 set by the user in the storage unit 5. That is, the position information 23 of the magnetic sensor 1 is updated with the latitude and the longitude values of the updated table 710. Thereafter, the control unit 14 returns the display unit 6 to the state shown in FIG. 10. Further, when the cancel button 86 is pressed, the control unit 14, without updating the position information 23 of the respective magnetic sensors 1, the display unit 6 is returned to the state shown in FIG. 10. With this configuration, it is possible to update the position information 23 of the magnetic sensor 1 individually. As a result, the usability of the user can be improved.

Figure 12:
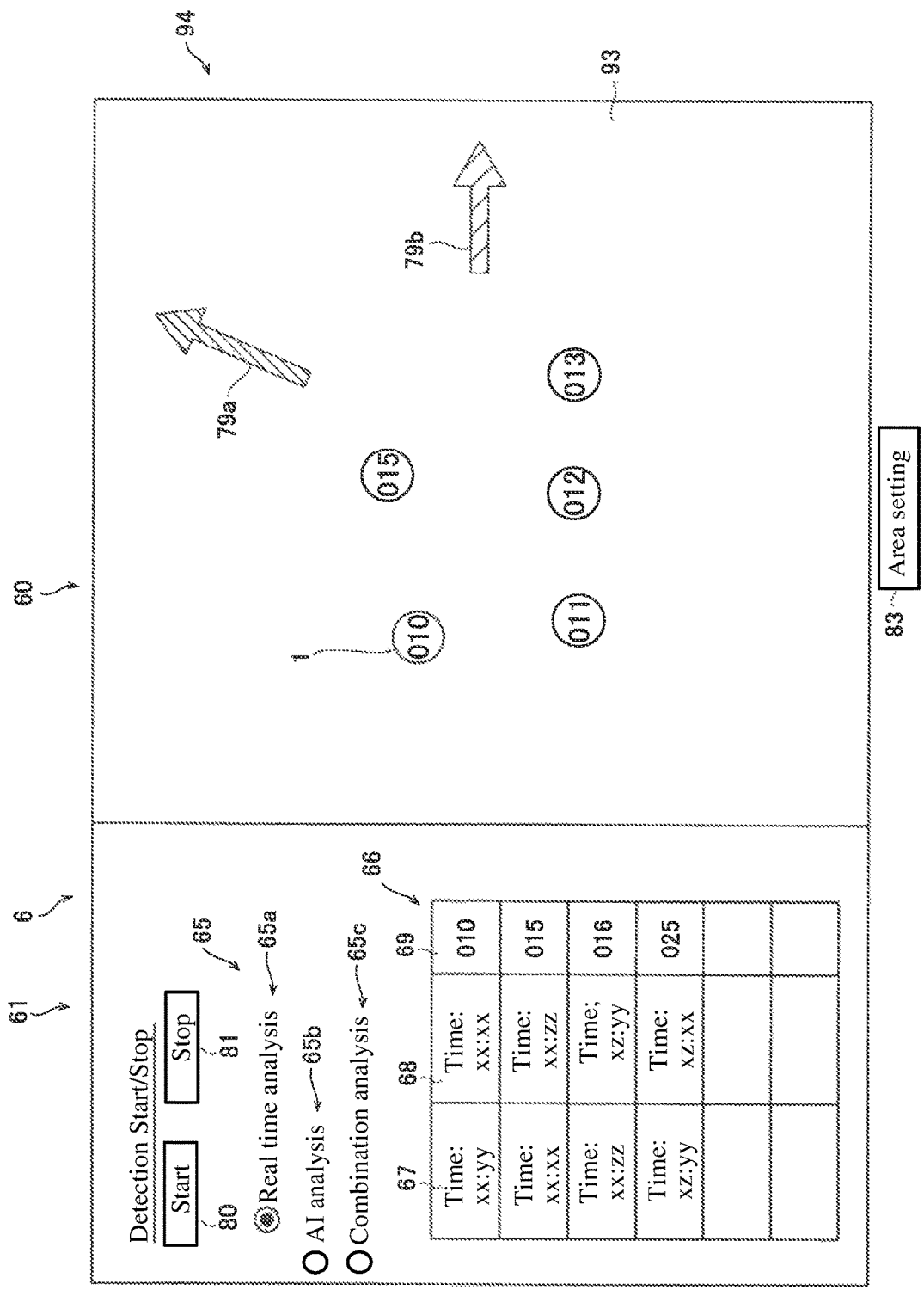
FIG. 12 is a schematic view showing an enlarged partial area of a first display area in a display unit of a magnetic detection system according to the first modification.

In the first modification, the map 94 displayed on the first display area 60 is configured to enlarge and display a part of the area. The control unit 14 is configured to display the marker indicating the direction of the land 92 when the land 92 (see FIG. 10) is not displayed when the first display area 60 is displayed in an enlarged manner. Specifically, as shown in FIG. 12, the control unit 14 is configured to display the marker indicating the direction of the land 92 when the magnetic sensor 1 is enlarged so that the land 92 does not appear (only the region of the sea 93 is displayed) on the map 94. Note that as shown in FIG. 12, it may be configured such that when the land 92 is located in different directions in the magnetic sensor 1, a plurality of markers, i.e., the marker 79*a* and the marker 79*b*, is displayed as markers indicating the direction of the land 92. The marker 79*a* and the marker 79*b* indicate the directions of the land 92 in different directions.

When displaying a plurality of markers, the control unit 14 may be configured to display the difference in the distance to the land 92 by differentiating the display modes of the marker 79*a* and the marker 79*b* from each other according to the distance to the land 92. In the example shown in FIG. 12, the marker 79*a* and the marker 79*b* are different in the display move by using different hatchings. Further, in the example shown in FIG. 12, the region 95 in FIG. 10 is enlarged. With this configuration, even when only the magnetic sensor 1 is displayed in a state in which the first display area 60 is enlarged and displayed since the direction of the land 92 is indicated by the marker, the position of the land 92 can be easily grasped even in a state in which the enlargement ratio is maintained.

Figure 13:
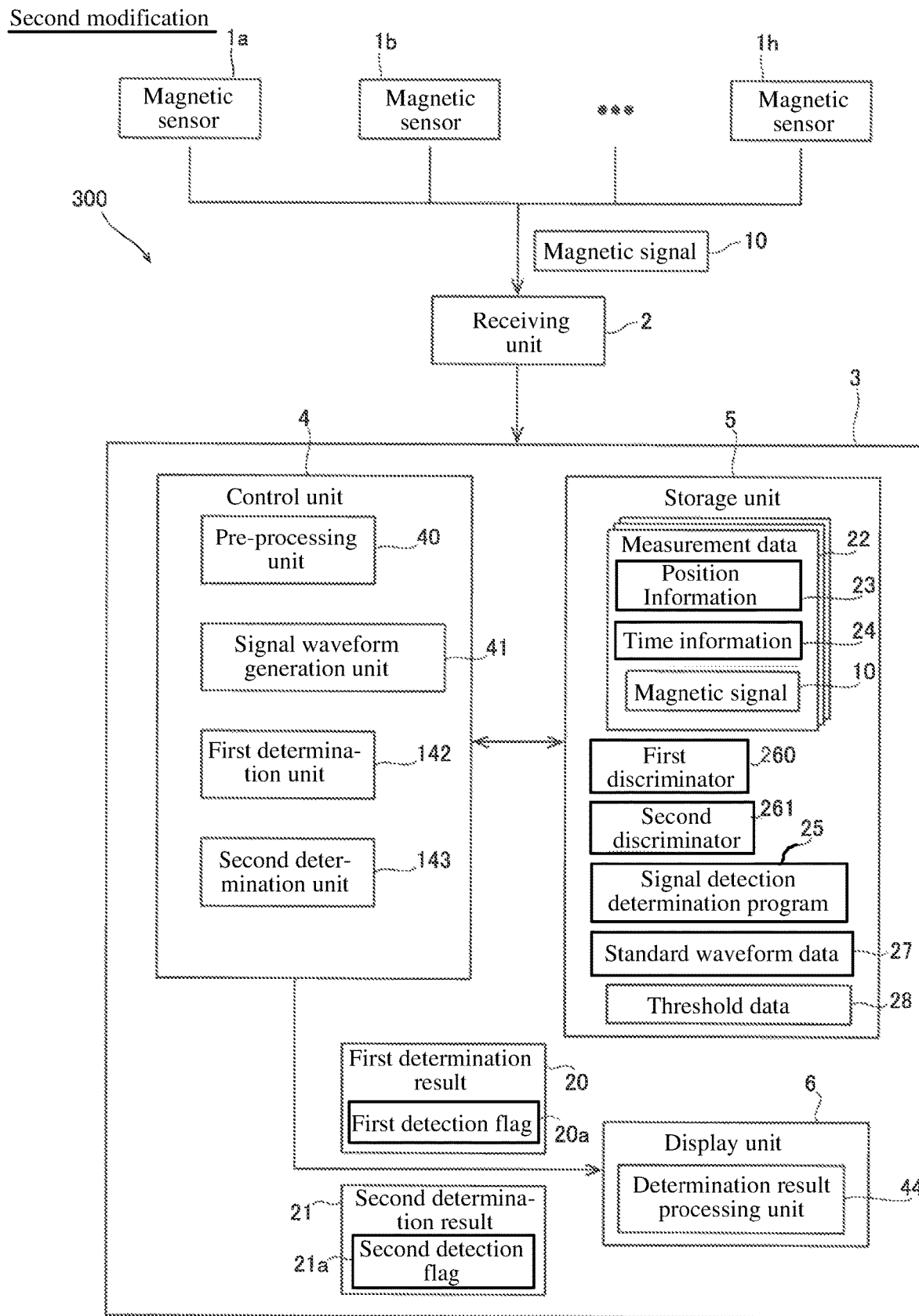
FIG. 13 is a block diagram showing a configuration of a magnetic detection system according to a second modification.

In the above-described embodiment, the first determination unit 42 outputs the acquired first determination result 20 based on the predetermined condition, and the second determination unit 43 outputs the second determination result 21 based on the discriminator 26 trained by machine learning, but the present invention is not limited thereto. For example, like the magnetic detection system 300 of the second modification shown in FIG. 13, each of the first determination unit 142 and the second determination unit 143 may be configured to output the first determination result 20 and the second determination result 21 according to the discriminator trained by machine learning.

The magnetic detection system 300 according to the second modification differs from the magnetic detection system 100 according to the above-described embodiment in that it includes: a first determination unit 142 instead of the first determination unit 42; and a second determination unit 143 instead of the second determination unit 43.

The first determination unit 142 according to the second modification is configured to output the first determination result 20 based on the first discriminator 260. The first determination unit 142 outputs the first detection flag 20*a* as the first determination result 20. The second determination unit 143 according to the second modification is configured to output the second determination result 21 based on the second discriminator 261. The second determination unit 143 outputs the second detection flag 21*a* as the second determination result 21. Since the configuration in which the first determination unit 142 outputs the first detection flag 20*a* and the configuration in which the second determination unit 143 outputs the second detection flag 21*a* are the same as the configuration in which the second determination unit 43 of the above-described embodiment outputs the second detection flag 21*a*. Therefore, the detailed descriptions thereof are omitted.

The first discriminator 260 and the second discriminator 261 are stored in the storage unit 5. The first discriminator 260 is a discriminator trained by machine learning. The second discriminator 261 is a discriminator trained by machine learning that differs from the first discriminator 260. Note that, in this specification, the different machine learning means machine learning that differs in at least one of a method of machine learning and a condition. For example, the second discriminator 261 is a discriminator trained by machine learning that can determine the magnetic signal 10, which cannot be determined by the first discriminator 260, as the machine learning that differs from the first discriminator 260.

In the magnetic detection system 300 according to the second modification, as described above, the first determination unit 142 is configured to output the first determination result 20 based on the first discriminator 260 trained by machine learning, and the second determination unit 143 is configured to output the second determination result 21 based on the second discriminator 261 trained by machine learning that differs from the first discriminator 260.

With this configuration, for example, by training the second discriminator 261 so that it becomes possible to determine the magnetic signal 10 that cannot be determined by the first discriminator 260, the first determination unit 142 and the second determination unit 143 can compensate for each other.

In addition, in the above-described embodiment, an example is described in which the second determination unit 43 outputs the second determination result 21 based on the discriminator 26 trained by machine learning, but the present invention is not limited thereto. For example, like the first determination unit 42, the second determination unit 43 may be configured to output the second determination result 21 based on a predetermined condition.

However, in cases where the second determination unit 43 is configured to output the second determination result 21 based on a predetermined condition, the predetermined condition needs to be set in more detail in order to make the determination accuracy of the second determination unit 43 higher than the determination accuracy of the first determination unit 42, which increases the designing costs. Therefore, it is preferable that second determination unit 43 have a configuration in which the second determination result 21 is output based on the discriminator 26

In the above-described embodiment, an example is shown in which the first determination unit 42 outputs the first determination result 20 using at least a part of the magnetic signal 10 within the prescribed time 70, but the present invention is not limited thereto. In the present invention, the first determination unit 42 may be configured to output the first determination result 20 using the entire waveform of the magnetic signal 10 at a prescribed time 70.

However, in cases where the first determination unit 42 is configured to output the first determination result 20 using the entire waveform of the magnetic signal 10 at the prescribed time 70, the determination accuracy is improved, but the immediacy is reduced. Therefore, it is preferable that the first determination unit 42 output the first determination result 20 using at least a part of the magnetic signal 10 within the prescribed time 70.

In the above-described embodiment, an example is shown in which the second determination unit 43 outputs the second determination result 21 using the entire waveform of the magnetic signal 10 at the prescribed time 70, but the present invention is not limited thereto. In the present invention, the second determination unit 43 may be configured to output the second determination result 21 using a part of the magnetic signal 10 within the prescribed time 70. In that case, the discriminator 26 may be trained using a simulation waveform in which the magnetic body 90 is passing.

However, in cases where the second determination unit 43 is configured to output the second determination result 21 using a part of the magnetic signal 10 within a prescribed time 70, the immediacy is improved, but the determination accuracy is reduced. Therefore, it is preferable that the second determination unit 43 output the second determination result 21 by using the entire waveform of the magnetic signal 10 at the prescribed time 70.

Further, in the above-described embodiment, the second determination unit 43 outputs the second detection flag 21*a*, but the present invention is not limited to this. For example, the second determination unit 43 may be configured to output the second determination result 21 other than the second detection flag 21*a*. For example, the second determination unit 43 may be configured to output, as the second determination result 21, a message, such as, e.g., "Passage Completed", indicating that the passage of the magnetic body 90 has been completed.

In the above-described embodiment, an example is shown in which the determination result processing unit 44 displayed, as the time information 24 to be displayed together with the second determination result 21, the number of minutes prior to the completion of the passage of the magnetic body 90, but the present invention is not limited thereto. For example, the determination result processing unit 44 may be configured to indicate, as the time information 24, the time at which the passage of the magnetic body 90 is completed.

In the above-described embodiment, an example is shown in which eight magnetic sensors 1 are provided, but the present invention is not limited to this configuration. The number of magnetic sensors 1 may be greater than 8 or less than 8. The number of magnetic sensors 1 may be set to match the region 91 in which the passage of the magnetic body 90 is desired.

In addition, in the above-described embodiment, an example is described in which the first determination result 20 and the second determination result 21 are displayed on the display unit 6 on the same screen, but the present invention is not limited thereto. For example, the first determination result 20 and the second determination result 21 may not be displayed on the same screen. However, it is preferable that the immediate first determination result 20 and the highly accurate second determination result 21 be displayed on the same screen.

In the above-described embodiment, the predetermined sampling period is determined based on the maximum value of the moving speed of the magnetic body 90, but the present invention is not limited thereto. For example, the predetermined sampling period may be determined based on the average value of the moving speed of the magnetic body 90. Further, the predetermined sampling period may be set for each moving speed of the magnetic body 90. That is, the magnetic sensor 1 may be configured to acquire the magnetic signal 10 based on a plurality of sampling periods.

In the above-described embodiment, the prescribed time 70 is determined based on the lowest moving speed of the magnetic body 90, but the present invention is not limited thereto. For example, the prescribed time 70 may be determined based on the average value of the moving speed of the magnetic body 90. The prescribed time 70 may be set for each moving speed of the magnetic body 90. The magnetic sensor 1 may be configured to acquire the magnetic signal 10 based on the prescribed time 70.

Further, in the above-described embodiment, as the standard waveform data 27, an example is shown in which three waveform data is used, the present invention is not limited thereto. The standard waveform data 27 may be more or less than three.

Further, in the above-described embodiment, an example is shown in which in the magnetic detection system 100, a plurality of magnetic sensors 1 is wired to the computer 3 via the receiving unit 2, the present invention is not limited thereto. In the present invention, the magnetic sensor 1, the receiving unit 2, and the computer 3 may be wirelessly connected.

In addition, in the above-described embodiment, an example is shown in which the notification unit is constituted by the display unit 6 for displaying the first determination result 20 and the second determination result 21, but the present invention is not limited thereto. For example, the notification unit may be composed of a buzzer that emits a warning sound or a lamp that emits warning light.

In the above-described embodiment, the fluxgate type magnetic sensor 1 is used, but the present invention is not limited to this. Any type of magnetic sensor may be used in the present invention. For example, an MR (Magneto Resistive) sensor, an MI (Magneto Impedance element) sensor, or the like may be used as the magnetic sensor 1.

[Aspects]

It will be appreciated by those skilled in the art that the above-described exemplary embodiments are illustrative of the following aspects.

(Item 1)

A magnetic detection system including:

a magnetic sensor configured to be installed underwater to acquire a magnetic signal;

a storage unit configured to store the magnetic signal acquired by the magnetic sensor;

a first determination unit configured to output whether or not a magnetic body has passed as a first determination result based on the magnetic signal of the magnetic sensor;

a second determination unit configured to output whether or not the magnetic body has passed as a second determination result based on the magnetic signal of the magnetic sensor after an output of the first determination result by the first determination unit; and a notification unit configured to output the first determination result and the second determination result, wherein the second determination unit is configured to have higher determination accuracy than the first determination unit.

(Item 2)

The magnetic detection system as recited in the above-described Item 1, wherein the first determination unit is configured to output the first determination result by determining the magnetic signal based on a predetermined condition, and wherein the second determination unit is configured to output the second determination result based on a discriminator trained by machine learning.

(Item 3)

The magnetic detection system as recited in the above-described Item 2, wherein the magnetic sensor is configured to acquire a time-series magnetic signal by a predetermined sampling period, wherein the first determination unit is configured to output the first determination result based on at least a part of the magnetic signal after a prescribed time has elapsed, and wherein the second determination unit is configured to output the second determination result based on the magnetic signal after the prescribed time has elapsed.

(Item 4)

The magnetic detection system as recited in the above-described Item 2 or 3, further comprising:

a signal waveform generation unit configured to generate a signal waveform by delimiting the time-series magnetic signal by the prescribed time, wherein the first determination unit is configured to sequentially output the first determination result based on whether or not at least a part of a shape of the signal waveform is a predetermined shape as the predetermined condition, after the prescribed time has elapsed, and wherein the second determination unit is configured to output the second determination result based on an entire waveform of the signal waveform after the prescribed time has elapsed.

(Item 5)

The magnetic detection system as recited in the above-described Item 1, wherein the first determination unit is configured to output the first determination result based on a first discriminator trained by machine learning, and wherein the second determination unit is configured to output the second determination result based on a second discriminator trained by machine learning, the second discriminator being different from the first discriminator.

(Item 6)

The magnetic detection system as recited in any one of the above-described Items 3 to 5, further comprising:

a determination result processing unit configured to make the notification unit notify that whether or not the magnetic body has passed, based on the first determination result and the second determination result, wherein the first determination unit is configured to output, as the first determination result, a first detection flag that is a value indicating whether or not the magnetic body has passed, wherein the second determination unit is configured to output, as the second determination result, a second detection flag that is a value indicating whether or not the magnetic body has passed, and wherein the determination result processing unit is configured to make the notification unit notify that whether or not the magnetic body has passed, based on the first detection flag and the second detection flag.

(Item 7)

The magnetic detection system as recited in the above-described Item 6, wherein the determination result processing unit is configured to make the notification unit notify that whether or not whether or not the magnetic body has passed by a change in a notification mode based on the first detection flag and the second detection flag.

(Item 8)

The magnetic detection system as recited in the above-described Item 6 or 7, wherein a plurality of the magnetic sensors is arranged in a region for detecting a passage of the magnetic body, and wherein the determination result processing unit is configured to make the notification unit notify that whether or not the magnetic body has passed in the region, based on the first determination result, the second determination result, and position information of the magnetic sensor.

(Item 9)

The magnetic detection system as recited in any one of the above-described Items 2 to 8, wherein the notification unit includes a display unit for displaying the first determination result and the second determination result on a same screen.

(Item 10)

The magnetic detection system as recited in any one of the above-described Items 2 to 9, wherein the predetermined sampling period is determined based on a maximal value of a moving speed of the magnetic body that is the detection target, and wherein the prescribed time is determined based on a minimum value of the moving speed.

The invention claimed is:

1. A magnetic detection system comprising:
a magnetic sensor configured to be installed underwater to acquire a time-series magnetic signal;
a storage unit configured to store the time-series magnetic signal acquired by the magnetic sensor;
a signal waveform generation unit configured to generate a signal waveform by delimiting the time-series magnetic signal by a prescribed time,
a first determination unit configured to output whether or not a magnetic body has passed as a first determination result based on the time-series magnetic signal of the magnetic sensor;
a second determination unit configured to output whether or not the magnetic body has passed as a second determination result based on the time-series magnetic signal of the magnetic sensor after an output of the first determination result by the first determination unit; and
a notification unit configured to output the first determination result and the second determination result,
wherein the second determination unit is configured to have higher determination accuracy than the first determination unit,
wherein the first determination unit is configured to sequentially output the first determination result based on whether or not at least a part of a shape of the signal waveform is a predetermined shape after the prescribed time has elapsed, and
wherein the second determination unit is configured to output the second determination result based on an entire waveform of the signal waveform after the prescribed time has elapsed.

2. The magnetic detection system as recited in claim 1, wherein the second determination unit is further configured to output the second determination result based on a discriminator trained by machine learning.

3. The magnetic detection system as recited in claim 2, further comprising:

a determination result processing unit configured to make the notification unit notify whether or not the magnetic body has passed, based on the first determination result and the second determination result, wherein the first determination unit is configured to output, as the first determination result, a first detection flag that is a value indicating whether or not the magnetic body has passed, wherein the second determination unit is configured to output, as the second determination result, a second detection flag that is a value indicating whether or not the magnetic body has passed, and wherein the determination result processing unit is configured to make the notification unit notify that whether or not the magnetic body has passed, based on the first detection flag and the second detection flag.

4. The magnetic detection system as recited in claim 3, wherein the determination result processing unit is configured to make the notification unit notify whether or not the magnetic body has passed by a change in a notification mode based on the first detection flag and the second detection flag.

5. The magnetic detection system as recited in claim 3, wherein a plurality of the magnetic sensors is arranged in a region for detecting a passage of the magnetic body, and wherein the determination result processing unit is configured to make the notification unit notify whether or not the magnetic body has passed in the region, based on the first determination result, the second determination result, and position information of the magnetic sensor.

6. The magnetic detection system as recited in claim 2, wherein the notification unit includes a display unit for displaying the first determination result and the second determination result on a same screen.

7. The magnetic detection system as recited in claim 1, wherein the first determination unit is further configured to output the first determination result based on a first discriminator trained by machine learning, and wherein the second determination unit is further configured to output the second determination result based on a second discriminator trained by machine learning, the second discriminator being different from the first discriminator.

8. The magnetic detection system as recited in claim 1, wherein a predetermined sampling period of the time-series magnetic signal is determined based on a maximal value of a moving speed of the magnetic body, and wherein the prescribed time is determined based on a minimum value of the moving speed.

* * * * *